United States Patent
Chau et al.

(10) Patent No.: US 9,612,290 B2
(45) Date of Patent: Apr. 4, 2017

(54) REDUCING OR AVOIDING NOISE IN MEASURED SIGNALS OF A TESTED BATTERY CELL(S) IN A BATTERY POWER SYSTEM USED TO DETERMINE STATE OF HEALTH (SOH)

(71) Applicants: Dat Tan Chau, Raleigh, NC (US); David Robert Battle, Durham, NC (US)

(72) Inventors: Dat Tan Chau, Raleigh, NC (US); David Robert Battle, Durham, NC (US)

(73) Assignee: NDSL, Inc., Raleigh, NC (US)

(*) Notice: Subject to any disclaimer, the term of this patent is extended or adjusted under 35 U.S.C. 154(b) by 190 days.

(21) Appl. No.: 14/564,927

(22) Filed: Dec. 9, 2014

(65) Prior Publication Data
US 2016/0109525 A1    Apr. 21, 2016

(51) Int. Cl.
*G01N 27/416*    (2006.01)
*G01R 31/36*    (2006.01)

(52) U.S. Cl.
CPC ..... *G01R 31/3658* (2013.01); *G01R 31/3679* (2013.01); *G01R 31/3662* (2013.01)

(58) Field of Classification Search
CPC .................................................. G01R 31/3648
USPC .................................................. 324/434, 426
See application file for complete search history.

(56) References Cited

U.S. PATENT DOCUMENTS

| | | | | |
|---|---|---|---|---|
| 3,885,552 A | * | 5/1975 | Kennedy | A61B 5/0006 128/904 |
| 4,234,926 A | * | 11/1980 | Wallace | G01D 9/005 700/2 |
| 5,589,757 A | * | 12/1996 | Klang | H01M 10/44 320/160 |
| 2010/0075207 A1 | * | 3/2010 | Yen | G01R 31/3679 429/90 |

(Continued)

OTHER PUBLICATIONS

Author Unknown, "12. Modulation and Demodulation," http://www.google.com/url?sa=t&rct=j&q=&esrc=s&source=web&cd=1&ved=OCCAQFjAA&url=http%3A%2F%2Fwww.elin.ttu.ee%2Fmesel%2FStudy%2FSubjects%2F5000_AMS%FConspect%2FLect_12.    doc&ei=8x-9VMDNI6KCsUdkIGADw&usg=AFQjCNGF8J1Ddb-Qg_1PjYAwCPXsyQJ65rg&bvm=bv.83829542,d.cWc, No Date, 16 pages.

(Continued)

*Primary Examiner* — M'Baye Diao
(74) *Attorney, Agent, or Firm* — Withrow & Terranova, PLLC

(57) ABSTRACT

Reducing or avoiding noise in measured signals of a tested battery cell(s) in a battery power system is disclosed. A battery monitoring device(s) coupled to a tested battery cell(s) applies test current pulses at a predetermined frequency to place an effective alternating current (AC) load on the tested battery cell(s). The resulting AC voltage signal generated across the tested battery cell(s) is sampled at the frequency of the test current to convert the AC voltage signal to a direct current (DC) voltage signal to be measured to determine the state-of-health of the tested battery cell(s). To avoid or reduce noise in the DC voltage signal, a noise spectrum of noise signals at defined frequencies induced on the tested battery cell(s) is determined. The battery monitoring device sets the frequency of the test current pulse at (Continued)

a determined reduced-noise frequency to avoid noise signals being present in the DC voltage signal.

37 Claims, 10 Drawing Sheets

(56) References Cited

U.S. PATENT DOCUMENTS

| | | | | |
|---|---|---|---|---|
| 2012/0025769 | A1* | 2/2012 | Kikuchi | B60L 3/0046 320/118 |
| 2012/0150464 | A1* | 6/2012 | Swanton | G01R 31/3689 702/63 |
| 2013/0293995 | A1 | 11/2013 | Brown et al. | |

OTHER PUBLICATIONS

Author Unknown, "About Lock-In Amplifiers," thinkSRS.com, Stanford Research Systems, http://www.thinksrs.com/downloads/PDFs/ApplicationNotes/AboutLIAs.pdf, No Date, 9 pages.

Author Unknown, "Bentham: 225 Lock-in Amplifier," Bentham Intruments Ltd., http://www.bentham.co.uk/pdf/ f225.pdf, No Date, 12 pages.

Platil, A., "An introduction to synchronous detection," http://measure.feld.cvut.cz/en/system/files/files/en/education/courses/AE3M38MSZ/SynchrDetectBW.pdf, No Date, 26 pages.

* cited by examiner

US 9,612,290 B2

REDUCING OR AVOIDING NOISE IN MEASURED SIGNALS OF A TESTED BATTERY CELL(S) IN A BATTERY POWER SYSTEM USED TO DETERMINE STATE OF HEALTH (SOH)

PRIORITY APPLICATION

The present application claims priority to U.S. Provisional Patent Application Ser. No. 62/064,245 filed on Oct. 15, 2014 entitled "Reducing Or Avoiding Noise In Measured Signals Of A Tested Battery Cell(s) In A Battery Power System Used To Determine State of Health (SOH)," which is incorporated herein by reference in its entirety.

BACKGROUND

I. Field of the Disclosure

The technology of the disclosure relates generally to battery monitoring systems for monitoring the state-of-health (SOH) of battery cells in battery power systems, such as uninterrupted power supplies (UPSs).

II. Background

An industrial system may rely on an uninterrupted power supply (UPS) to provide backup power in the event of failure of a primary power system. The UPS may be provided in the form of a number of lead acid battery cells electrically connected in series. A battery charger is provided that keeps the battery cells charged in the event backup power is needed from the battery cells. However, each battery cell will eventually fail. For example, lead acid batteries may lose the ability to accept a charge when discharged over time due to sulfation. A battery containing one or more failed battery cells may be unable to power the industrial system at specified battery operating voltages, at specified battery operating currents, and/or for specified battery time durations.

Accordingly, an industrial system may employ a battery monitoring system to monitor the state-of-health (SOH) of battery cells in a battery power supply system. The SOH of a battery cell may be correlated with an ohmic value of the battery cell, such as an internal resistance, internal impedance, and/or internal conductance of the battery cell. For example, an increased internal resistance, increased internal impedance, and/or decreased internal conductance of a battery cell may be used to detect an impending failure or failure of the battery cell. In this regard, a battery cell that has been detected to have the impending failure or to have failed may be replaced.

In this regard, FIG. 1 illustrates a battery monitoring system 10. The battery monitoring system 10 comprises a battery monitoring device 14 and a battery monitoring system control unit 12 for controlling the battery monitoring device 14. The battery monitoring device 14 is configured to test ohmic values 16 of battery cells 18 of a battery power supply system provided in the form of a battery 20. The battery 20 of the battery power supply system may be used to provide a backup battery supply, such as an uninterrupted power supply (UPS), to supply power to power-consuming components or systems. The battery 20 is comprised of a plurality of battery cells 18(1)-18(4) electrically connected in series. Each battery monitoring device 14 may be coupled to a subset 22 of the battery cells 18(1)-18(4) electrically connected in series and in a sequential order to form the battery 20. The subset 22 of battery cells 18(1)-18(4) may comprise a battery cell substring comprising a unique set of battery cells 18 of the battery 20. The battery monitoring device 14 provides a pair of current-inducing leads L1, L2 configured to be coupled to the negative and positive terminals of a battery cell substring of the battery 20. The battery monitoring system control unit 12 instructs the battery monitoring device 14 to produce a current through the subset 22 of battery cells 18(1)-18(4) (i.e., one or more of the battery cells 18(1)-18(4)) by activating a switch to place a resistive load in a current loop with the subset 22 of battery cells 18(1)-18(4)) of the battery 20.

The battery monitoring device 14 also provides a plurality of voltage sensing leads V1-V5. The voltage sensing leads V1-V5 are configured to be coupled to measure a voltage across the negative and positive terminals of each battery cell 18(1)-18(4). As illustrated in FIG. 1, voltage leads V1-V5 have resistances $R_{V1}$-$R_{V5}$ and current leads L1-L2 have resistances $R_{L1}$-$R_{L2}$. To increase the accuracy of measured voltages, the battery monitoring device 14 may employ Kelvin sensing. In this regard, separate voltage leads V1, V5 (for sensing voltages) may optionally be provided separate from the current leads L1, L2. Providing the current leads L1, L2 separate from the voltage leads V1-V5 allows the voltages measured by the voltage leads V1-V5 to be more accurate than a system in which a single lead is used for both L1 and V1 and another single lead is used for both L2 and V5. This is because separating the current lead L1 from the voltage lead V1 and separating the current lead L2 from the voltage lead V5 significantly reduces the impedance contribution of the voltage leads V1, V5. Because there is almost no current flow in the voltage leads V1, V5, the voltage drop across the voltage leads V1, V5 (i.e., across $R_{V1}$ and $R_{V5}$) is lower. As a result, using separate current leads L1, L2 and voltage leads V1, V5 enables a more accurate measurement of the voltages across the battery cells 18(1)-18(4).

To determine the SOH of a tested battery cell 18 among a subset 22 of the battery cells 18(1)-18(4), an assigned battery monitoring device 14 determines an ohmic value 16 of the tested battery cell(s) 18. The ohmic value 16 of the tested battery cell(s) 18 is determined by placing a current load across the tested battery cell(s) 18 to place an effective load on the tested battery cell(s) 18. The current load causes the tested battery cell(s) 18 to draw a predetermined amount of current from the tested battery cell(s) 18. The resulting voltage across the tested battery cell(s) 18 is then measured to determine to ohmic value 16 of the tested battery cell(s) 18 according to Ohm's law, to determine the SOH of the tested battery cell(s) 18.

SUMMARY

Embodiments disclosed herein include reducing or avoiding noise in measured signals of a tested battery cell(s) in a battery power system used to determine state-of-health (SOH) of the battery power system. Related battery monitoring devices, systems, and methods are disclosed. As a non-limiting example, the battery supply system could be a battery power supply system used to provide backup power to power-consuming devices or systems. In this regard, one or more battery monitoring devices are provided in a battery monitoring system. The battery monitoring devices are each configured to be coupled to a subset of battery cells electrically connected in series that form a battery, to determine their SOH. To test a battery cell(s) in the battery power system, the battery monitoring device is configured to apply a load of a series of short duration test current pulses at a predetermined frequency ("test current") to place an effective alternating current (AC) load on the tested battery cell(s). Applying a load of short duration current pulses to test a battery cell(s), as opposed to higher currents, reduces the load placed on the tested battery cell(s) to reduce the impact of testing on battery cell performance. The resulting AC voltage signal generated across the tested battery cell(s) is sampled at the frequency of the test current to convert the AC voltage signal to a direct current (DC) voltage signal. The voltage of the DC voltage signal can then be measured to determine the SOH of the tested battery cell(s). For example, the ohmic value of the tested battery cell(s) can be determined from the measured DC voltage signal to determine the SOH of the tested battery cell(s).

Noise signals present in the battery power system may be induced on the AC voltage signal generated across the tested battery cell(s) in response to the test current applied by a battery monitoring device to the tested battery cell(s). If these noise signals include frequencies that are at or close to the frequency of the test current, these noise signals may be present in the DC voltage signal generated as a result of sampling the AC voltage signal generated across the tested battery cell(s) at the frequency of the test current. Thus, the measured voltage of the DC voltage signal used to determine the SOH of the tested battery cell(s) may be less accurate, because the DC voltage signal will include noise. Thus, to avoid or reduce noise from being present in the DC voltage signal generated by the tested battery cell(s) as a result of sampling the AC voltage signal generated across the tested battery cell(s) at the frequency of the test current, a noise spectrum of noise signals at defined frequencies induced on the tested battery cell(s) is determined. The noise spectrum is analyzed to determine frequencies at which noise is reduced or not present. In this manner, the battery monitoring device can be configured to set the frequency of the test current at a determined reduced-noise frequency to a test battery cell(s) to avoid the noise signals being present in the DC voltage signal generated as a result of sampling the AC voltage signal generated across the tested battery cell(s). Thus, the SOH of the tested battery cells(s) determined from the reduced noise DC voltage signal may be more accurate.

In this regard, in one aspect, a battery monitoring device for testing at least one battery cell in a battery power system is provided. The battery monitoring device comprises a test current circuit. The test current circuit is configured to receive a test frequency setting signal indicating a test frequency setting. The test current circuit is also configured to apply a test current pulse load at a test frequency based on the test frequency setting in the received test frequency setting signal to at least one battery cell, to place an effective alternating current (AC) load on the at least one battery cell. The battery monitoring device also comprises a demodulation circuit. The demodulation circuit is configured to receive an AC voltage signal generated across the at least one battery cell as a result of the test current pulse load applied to the at least one battery cell. The demodulation circuit is also configured to convert the received AC voltage signal to a DC voltage signal indicative of the SOH of the at least one battery cell based on a sampling frequency. The demodulation circuit is also configured to measure the voltage of the DC voltage signal to determine the SOH of the at least one battery cell. The battery monitoring device also comprises a noise detecting circuit. The noise detecting circuit is configured to determine a noise spectrum of the at least one battery cell. The noise detecting circuit is also configured to generate the test frequency setting signal indicating the test frequency setting based on the determined noise spectrum as the test frequency setting.

In another aspect, a method of testing at least one battery cell in a battery power system is provided. The method comprises applying a test current pulse at a test frequency based on a test frequency setting in a received test frequency setting signal to at least one battery cell, to place an effective alternating current (AC) load on the at least one battery cell. The method also comprises receiving an AC voltage signal generated across the at least one battery cell as a result of the test current pulse applied to the at least one battery cell. The method also comprises converting the received AC voltage signal to a DC voltage signal indicative of the SOH of the at least one battery cell based on a sampling frequency. The method also comprises measuring the voltage of the DC voltage signal to determine the SOH of the at least one battery cell. The method also comprises determine a noise spectrum of the at least one battery cell. The method also comprises generating the test frequency setting signal indicating the test frequency setting based on the determined noise spectrum as the test frequency setting.

In another aspect, a non-transitory computer-readable medium having stored thereon computer-executable instructions is provided. The computer-executable instructions cause a processor to implement a method for testing at least one battery cell in a battery power system. The method for testing comprises applying a test current pulse at a test frequency based on a test frequency setting in a received test frequency setting signal to at least one battery cell, to place an effective alternating current (AC) load on the at least one battery cell. The method for testing also comprises receiving an AC voltage signal generated across the at least one battery cell as a result of the test current pulse applied to the at least one battery cell. The method for testing also comprises converting the received AC voltage signal to a DC voltage signal indicative of the state-of-health (SOH) of the at least one battery cell based on a sampling frequency. The method for testing also comprises measuring the voltage of the DC voltage signal to determine the SOH of the at least one battery cell. The method for testing also comprises determining a noise spectrum of the at least one battery cell. The method for testing also comprises generating the test frequency setting signal indicating the test frequency setting based on the determined noise spectrum as the test frequency setting.

In another aspect, a battery monitoring system for testing battery cells in a battery power system is provided. The battery monitoring system comprises a plurality of battery monitoring devices, each battery monitoring device configured to be coupled to a subset of a plurality of battery cells electrically connected in series to form a battery. Each battery monitoring device comprises a plurality of current leads configured to be coupled to the subset of the plurality of battery cells assigned to the battery monitoring device. Each battery monitoring device is configured to apply a test current pulse at a test frequency based on a test frequency setting in a received test frequency setting signal to the subset of the plurality of battery cells, to place an effective alternating current (AC) load on the subset of the plurality of battery cells. Each battery monitoring device is also configured to receive an AC voltage signal generated across the subset of the plurality of battery cells as a result of the test current pulse applied to the subset of the plurality of battery cells. Each battery monitoring device is also configured to convert the received AC voltage signal to a DC voltage signal indicative of the SOH of the subset of the plurality of battery cells based on a sampling frequency. Each battery monitoring device further comprises a plurality of voltage leads configured to be coupled to the subset of the plurality of battery cells assigned to the battery monitoring device to measure the voltage of the DC voltage signal to determine the SOH of the subset of the plurality of battery cells. The battery monitoring system also comprises a battery monitoring system control unit. The battery monitoring system control unit is configured to control each battery monitoring device among the plurality of battery monitoring devices to test a subset of the plurality of battery cells coupled to the battery monitoring device. The battery monitoring system control unit is also configured to receive at least one battery current measurement from each battery monitoring device among the plurality of battery monitoring devices indicating the SOH of the subset of the plurality of battery cells coupled to the battery monitoring device.

At least one battery monitoring device among the plurality of battery monitoring devices is configured to determine a noise spectrum of the subset of the plurality of battery cells coupled to the at least one battery monitoring device, and to generate the test frequency setting signal indicating the test frequency setting based on the determined noise spectrum as the test frequency setting.

DETAILED DESCRIPTION

Figure 1:
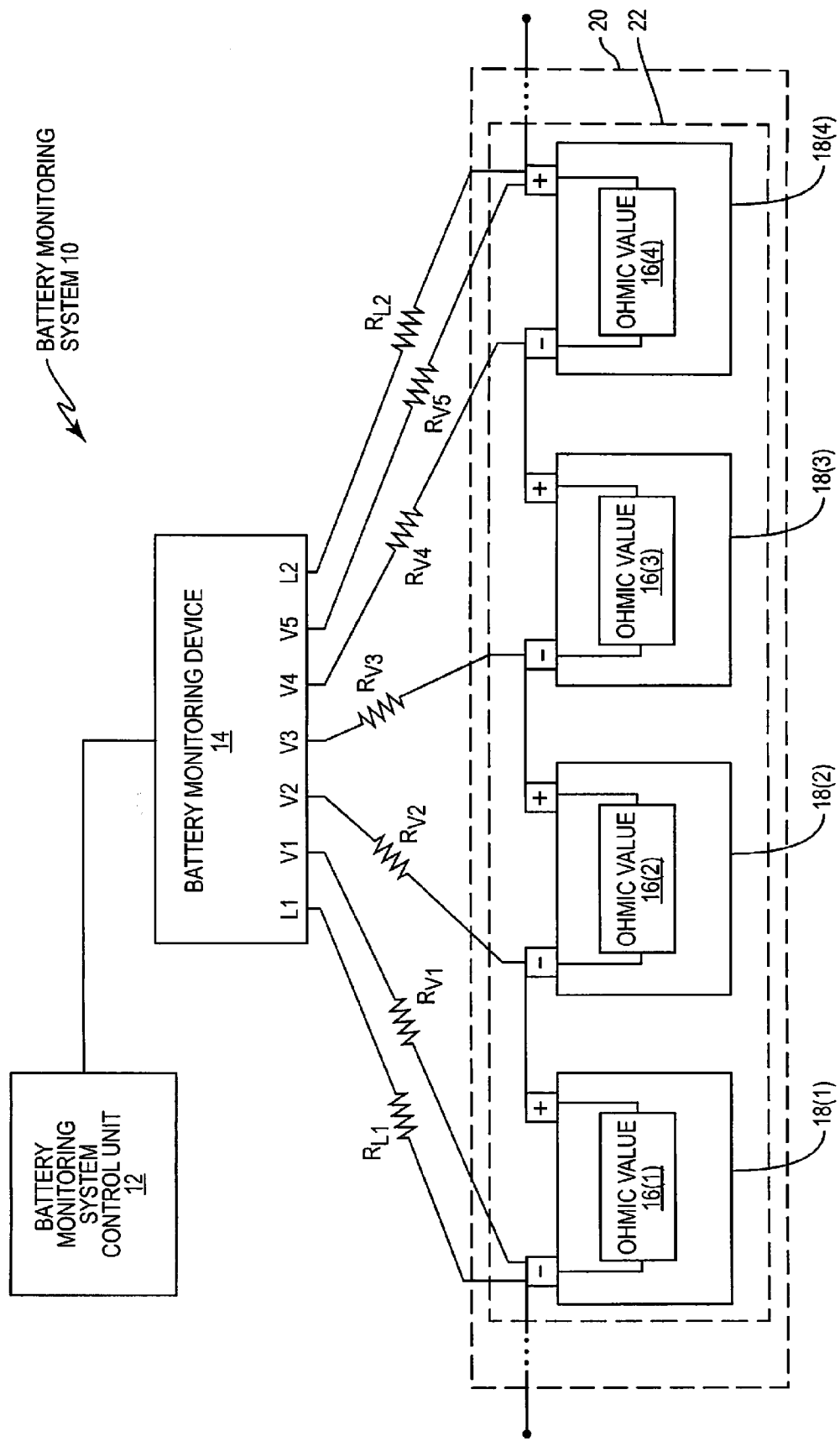
FIG. 1 is a block diagram of an exemplary battery monitoring system that includes battery cells electrically connected in series to form a battery power supply system, a battery monitoring device, and a control unit for controlling the battery monitoring device.

With reference now to the drawing figures, several exemplary embodiments of the present disclosure are described. The word "exemplary" is used herein to mean "serving as an example, instance, or illustration." Any embodiment described herein as "exemplary" is not necessarily to be construed as preferred or advantageous over other embodiments.

Embodiments disclosed herein include reducing or avoiding noise in measured signals of a tested battery cell(s) in a battery power system used to determine state-of-health (SOH) of the battery power system. Related battery monitoring devices, systems, and methods are disclosed. As a non-limiting example, the battery supply system could be a battery power supply system used to provide backup power to power-consuming devices or systems. In this regard, one or more battery monitoring devices are provided in a battery monitoring system. The battery monitoring devices are each configured to be coupled to a subset of battery cells electrically connected in a series that forms a battery, to determine their SOH. To test a battery cell(s) in the battery power system, the battery monitoring device is configured to apply a load of a series of short duration test current pulses at a predetermined frequency ("test current") to place an effective alternating current (AC) load on the tested battery cell(s). Applying a load of short duration current pulses to test a battery cell(s), as opposed to higher currents, reduces the load placed on the tested battery cell(s) to reduce the impact of testing on battery cell performance. The resulting AC voltage signal generated across the tested battery cell(s) is sampled at the frequency of the test current to convert the AC voltage signal to a direct current (DC) voltage signal. The voltage of the DC voltage signal can then be measured to determine the SOH of the tested battery cell(s). For example, the ohmic value of the tested battery cell(s) can be determined from the measured DC voltage signal to determine the SOH of the tested battery cell(s).

Noise signals present in the battery power system may be induced on the AC voltage signal generated across the tested battery cell(s) in response to the test current applied by a battery monitoring device to the tested battery cell(s). If these noise signals include frequencies that are at or close to the frequency of the test current, these noise signals may be present in the DC voltage signal generated as a result of sampling the AC voltage signal generated across the tested battery cell(s) at the frequency of the test current. Thus, the measured voltage of the DC voltage signal used to determine the SOH of the tested battery cell(s) may be less accurate, because the DC voltage signal will include noise. Thus, to avoid or reduce noise from being present in the DC voltage signal generated by the tested battery cell(s) as a result of sampling the AC voltage signal generated across the tested battery cell(s) at the frequency of the test current, a noise spectrum of noise signals at defined frequencies induced on the tested battery cell(s) is determined. The noise spectrum is analyzed to determine frequencies at which noise is reduced or not present. In this manner, the battery monitoring device can be configured to set the frequency of the test current at a determined reduced-noise frequency to a test battery cell(s) to avoid the noise signals being present in the DC voltage signal generated as a result of sampling the AC voltage signal generated across the tested battery cell(s). Thus, the SOH of the tested battery cells(s) determined from the reduced noise DC voltage signal may be more accurate.

Figure 2:
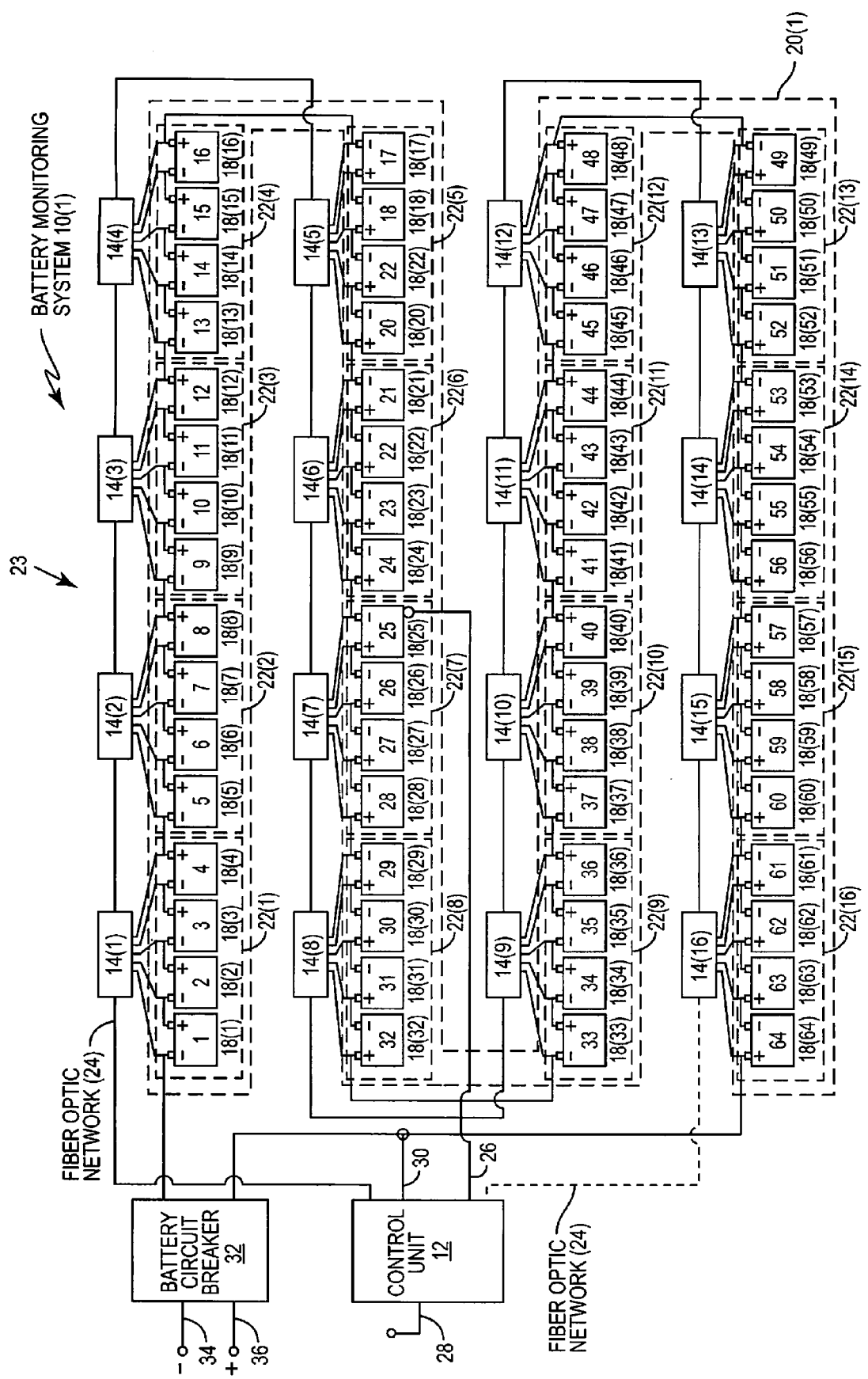
FIG. 2 is a block diagram of a battery power supply system including a battery monitoring system employing a plurality of battery monitoring devices, each configured to measure ohmic values of tested battery cells assigned to a particular battery monitoring device by applying a series of current pulses at a predetermined frequency for a predetermined period of time to a tested battery cell.

In this regard, referring to FIG. 2, a battery power supply system 23 in the form of an uninterrupted power supply (UPS) for an industrial system is provided. The battery power supply system 23 may include a large number of battery cells 18. For example, battery cells 18(1)-18(64) are provided in FIG. 2 that are all connected in series to form a battery 20(1). By having a large number of battery cells 18, the battery power supply 32 may provide an increased amount of power, an increased duration of power, an increased amount of voltage, and/or an increased amount of current. Because the battery 20(1) comprises a large number of battery cells 18, the battery monitoring system 10(1) may comprise a plurality of battery monitoring devices 14 (as a non-limiting example, battery monitoring devices 14(1)-14(16) to monitor subsets 22(1)-22(16) of the battery cells 18(1)-18(64). In this example, each subset 22 of battery cells 18 comprises four (4) battery cells 18 (e.g., subset 22(1) comprises battery cells 18(1)-18(4)). As will be discussed in more detail below, battery monitoring devices 14(1)-14(6) are configured to determine the noise spectrum of the batteries 18, to select a frequency of applied current pulses to a tested battery cell(s) 18 to reduce the noise level in measured signal values of tested battery cell(s) 18. Also, in this example, because there are multiple battery monitoring devices 14(1)-14(16), one or more battery monitoring system control units 12 may be provided to control the battery monitoring devices 14.

With continuing reference to FIG. 2, the battery monitoring devices 14(1)-14(16) are coupled to a fiber optic network 24. The fiber optic network 24 is provided in lieu of an electricity-conducting network in this non-limiting example so that electricity stored in the battery cells 18(1)-18(64) is unable to be conducted through the fiber optic network 24 connecting the plurality of battery monitoring devices 14(1)-14(16) and the battery monitoring system control unit 12. However, the fiber optic network 24 could be provided as an electrical-conducting network if desired. As illustrated in FIG. 2, the fiber optic network 24 may form a fiber optic loop. In this regard, two interface ports of the battery monitoring system control unit 12 may be coupled to the fiber optic network 24. The battery monitoring system control unit 12 may have a single interface port connecting the battery monitoring system control unit 12 to the plurality of battery monitoring devices 14(1)-14(16) to network the battery monitoring system control unit 12 and the battery monitoring devices 14(1)-14(16) together.

The battery monitoring system control unit 12 in FIG. 2 may also comprise a battery cell temperature sensor(s) 26 and/or an ambient temperature sensor(s) 28. The battery cell temperature sensor(s) 26 may be coupled to at least one battery cell (as a non-limiting example, battery cell 18(25)) of the battery 20 for measuring one or more pilot temperatures of the battery 20. The battery monitoring system control unit 12 may also comprise a current sensor(s) 30 for sensing current of the battery 20.

The battery power supply system 23 in FIG. 2 may also comprise a battery circuit breaker 32 for protecting the battery 20 from overcurrents. The battery circuit breaker 32 may also provide a negative terminal 34 of the battery 20 and a positive terminal 36 of the battery 20 for external loading. In some embodiments, the battery monitoring system 10(1) may comprise two or more battery circuit breakers 32. The two or more battery circuit breakers 32 may protect different subsets 22 of battery cells 18 of the battery 20. As a non-limiting example, two battery circuit breakers 32 may be provided. A first of the two battery circuit breakers may be connected to the negative terminal 34 and a center terminal (as a non-limiting example, the positive terminal 36 of battery cell 18 of the battery 20. The second of the two battery circuit breakers 32 may be connected to the center terminal and the positive terminal 36 of the battery 20. In this manner, a maximum current and/or maximum voltage experienced by a device and/or user shorting across the negative and positive terminals 34, 36 of a single battery circuit breaker 32 may be reduced.

The battery monitoring system control unit 12 tests the battery cells 18 (as a non-limiting example, battery cells 18(1)-18(64)) of the battery 20 in this example. For example, the battery monitoring system control unit 12 can first instruct the battery monitoring device 14(1) to test battery cells 18(1)-18(4). The battery monitoring system control unit 12 can then instruct the other battery monitoring devices 14(2)-14(16) to test the other battery cells 18(5), 18(6) . . . 18(63), and 18(64), as desired. Each battery cell 18 may be tested as follows. The battery monitoring system control unit 12 instructs the battery monitoring device 14 assigned to the battery cell 18 to couple a current-inducing load to the subset 22 (as a non-limiting example, a battery cell substring) of the battery cells 18 monitored by the battery monitoring device 14. The battery monitoring system control unit 12 instructs the battery monitoring device 14 assigned to the battery cell 18 to measure the voltage of the battery cell 18. The battery monitoring system control unit 12 determines (or instructs the battery monitoring device 14 to determine) the ohmic value 16 of a tested battery cell 18 as a measured signal of the tested battery cell 18 based on the measured voltage in this example. The battery monitoring system control unit 12 decouples the current-inducing load from the subset 22 of the battery cells 18 to stop inducing the current through the subset 22 of the battery cells 18 monitored by the battery monitoring device 14 assigned to the battery cell.

In the example of the battery monitoring system 10(1) in the battery power supply system 23 in FIG. 2, an AC signal is provided as the current-inducing load to a test battery cell(s) 18. The applied AC voltage signal tested battery cell(s) 18 is determined by applying a current across the tested battery cell(s) 18 to place an effective load on the tested battery cell(s) 18. The applied current draws a predetermined amount of current from the tested battery cell(s) 18. The resulting voltage across the tested battery cell(s) 18 is then measured to determine to the ohmic value 16 of the tested battery cell(s) 18 according to Ohm's law, to determine the SOH of the tested battery cell(s) 18.

Figure 3:
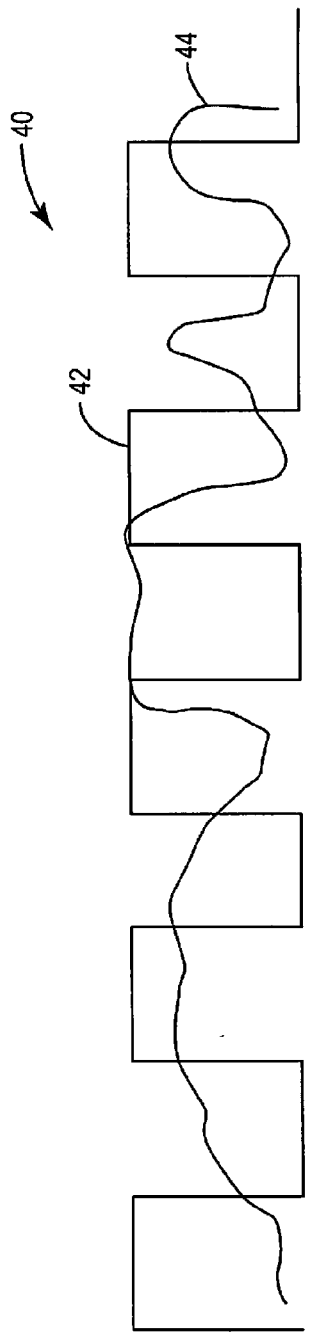
FIG. 3 is a diagram of an alternating current (AC) voltage signal generated across the tested battery cell(s) in FIG. 2 as a result of a current pulse signal applied into a tested battery cell(s) by a battery monitoring device with induced noise from other loads in the battery power system.

In this regard, FIG. 3 is a diagram of an AC voltage signal 40 generated across the tested battery cell(s) 18 in FIG. 2 as a result of a current pulse signal ("test current") applied into a tested battery cell(s) 18 by an assigned battery monitoring device 14. The AC voltage signal 40 can be used to determine the ohmic value 16 of a tested battery cell(s) 18 to determine the SOH of the tested battery cell(s) 18. As shown in FIG. 3, the AC voltage signal 40 is a voltage pulse waveform 42, because the test current was also a pulse waveform generated by the battery monitoring device 14 as short duration pulses of current. As also shown in FIG. 3, the AC voltage signal 40 also includes induced noise 44 induced on the tested battery cell(s) 18 from other loads in the battery 20 or battery power supply system 23 in FIG. 2. For example, the induced noise 44 may be generated as the result of harmonic signals at common power frequencies (e.g., 100 Hz, 150 Hz, 200 Hz, 250 Hz, . . . for a 50 Hz power signal, and 120 Hz, 180 Hz, 240 Hz, 300 Hz, . . . for a 60 Hz power signal). Thus, this induced noise 44 can cause the AC voltage signal 40 to be inaccurate, and thus cause a calculated ohmic value 16 of a tested battery cell(s) 18 from which the AC voltage signal 40 was generated to also be inaccurate.

Figure 4:
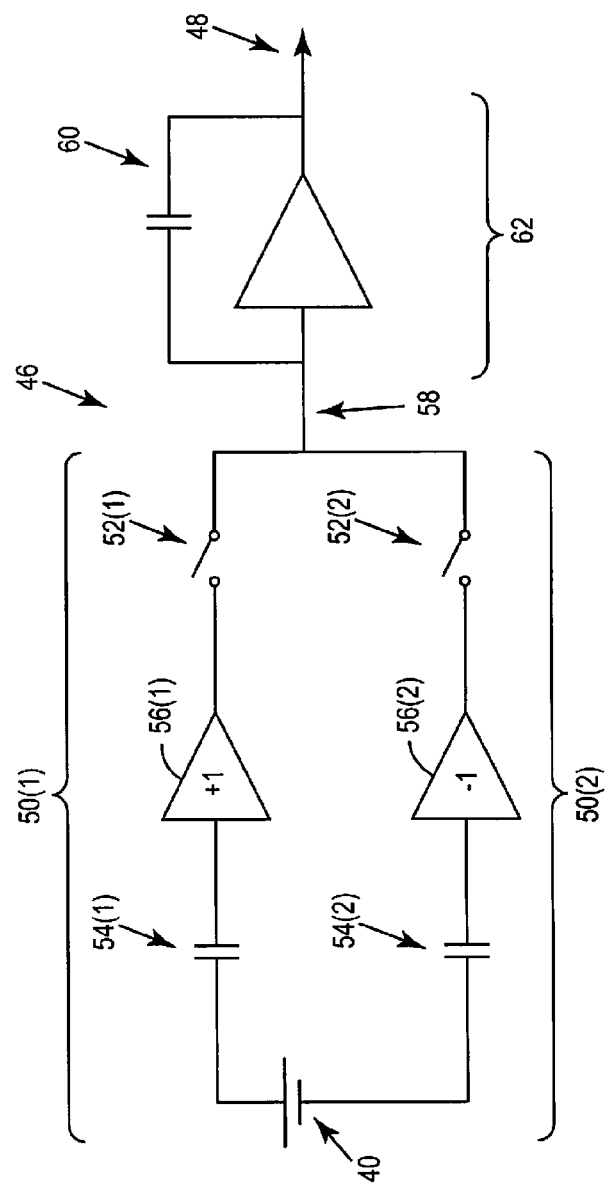
FIG. 4 is a block diagram of an exemplary synchronous demodulator configured to converted the AC voltage signal generated across the tested battery cell(s) with induced noise in FIG. 3, into a direct current (DC) voltage signal to be measured to determine a state-of-health (SOH) of the tested battery cell(s)

In this regard, FIG. 4 is a block diagram of an exemplary demodulator circuit 46 that can be provided in the battery monitoring devices 14 to convert the received AC voltage signal 40 generated across a tested battery cell(s) 18 with induced noise 44 in FIG. 3, into a DC voltage signal 48 to be measured to determine a SOH of the tested battery cell(s) 18. In the example in FIG. 3, the demodulator circuit 46 is a synchronous demodulator. The demodulator circuit 46 includes two signal paths 50(1), 50(2) that are controlled by respective switches 52(1), 52(2). Filters 54(1), 54(2) are provided in the respective signal paths 50(1), 50(2) to filter out unwanted DC signals from the AC voltage signal 40. For example, the filters 54(1), 54(2) may be capacitors. The signal path 50(1) includes a +1 amplifier 56(1), and the signal path 50(2) includes a −1 amplifier 56(2). Thus, when the switches 52(1), 52(2) are alternatingly connected in a synchronous fashion, the AC voltage signal 40 in FIG. 3 is sampled by being multiplied by +1 and multiplied by −1 by the +1 amplifier and −1 amplifier 56(1), 56(2), respectively. If the switches 52(1), 52(2) are switched in phase with the frequency of the test current applied into the tested battery cell(s) 18 that generated the AC voltage signal 40 in FIG. 3, the alternating switching of the signal paths 50(1), 50(2) will convert the AC voltage signal 40 into a DC voltage signal 58 to provide the DC voltage signal 48. As previously discussed, the DC voltage signal 48 can then be measured to determine the SOH of the tested battery cell(s) 18.

With continuing reference to FIG. 4, if the induced noise 44 in the AC voltage signal 40 is not at the same frequency as the voltage waveform 42 in the AC voltage signal 40 in FIG. 3, such induced noise 44 will be present in the converted DC voltage signal 58 as an AC component. Thus, an AC filter 60 is provided in the output stage 62 of the demodulator circuit 46 can be provided to filter out such unwanted induced noise 44 as an AC component in the converted DC voltage signal 58 to provide the resulting DC voltage signal 48. However, if any of the induced noise 44 in the AC voltage signal 40 is at same frequency and phase as the voltage waveform 42 in the AC voltage signal 40 in FIG. 3, such induced noise 44 will also get converted into a DC component provided in the DC voltage signal 58. Thus, this induced noise 44 will not get filtered out of the DC voltage signal 58 by the AC filter 60. Thus, such induced noise 44 converted to DC and included in the DC voltage signal 48 causes the DC voltage signal 48 to be less accurate or inaccurate. Thus, any SOH determination made from a measurement of the DC voltage signal 48 will also be less accurate or inaccurate.

To avoid or reduce the induced noise 44 being at the same frequency and phase as the AC voltage signal 40 generated across a tested battery cell(s) 18 (and thus present in the DC voltage signal 48), the battery monitoring devices 14 in the battery power supply system 23 in FIG. 2 are configured to control the frequency of the pulsed test current 74 applied to the tested battery cell(s) 18. If the frequency of the pulsed test current applied to the tested battery cell(s) 18 can be controlled to be set to a frequency that does not include noise or reduced noise, any induced noise 44 in the AC voltage signal 40 in FIG. 3 will be out of phase with the voltage pulse waveform 42 in the AC voltage signal 40 in FIG. 3. Thus, such induced noise 44 would be an AC component in the DC voltage signal 58 in the demodulator circuit 46 in FIG. 4, which could then be filtered out of the DC voltage signal 48 by the AC filter 60. However, to control the frequency of the pulsed test current applied to the tested battery cell(s) 18 in this advantageous manner, the frequencies of the noise in the battery monitoring system 10(1) must be known.

Figure 5:
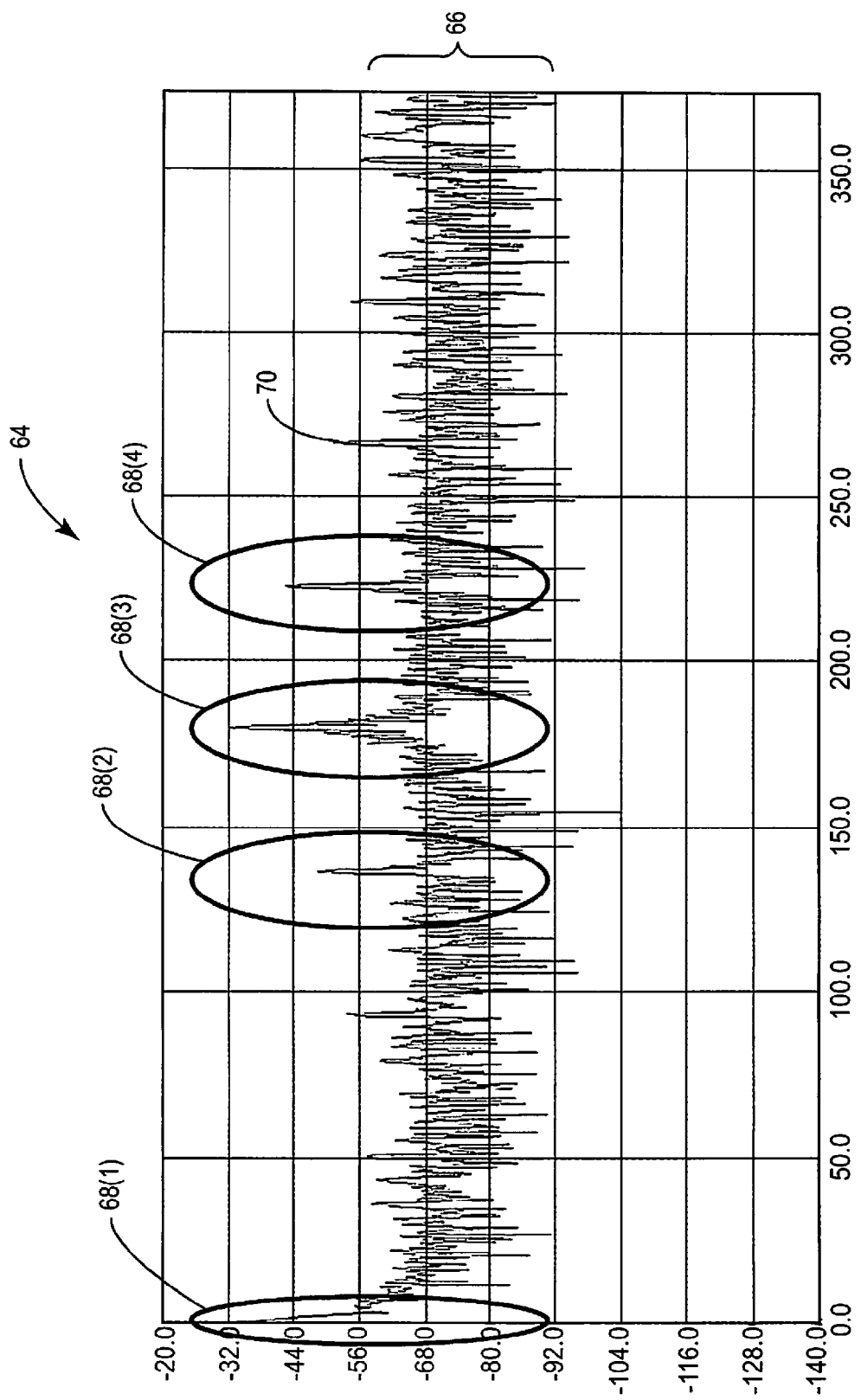
FIG. 5 is a graph illustrating an exemplary noise spectrum in the battery monitoring system of FIG. 2.

In this regard, FIG. 5 is a graph 64 illustrating an exemplary noise spectrum 66 in the battery power supply system 23 of FIG. 2 between 1 Hz and approximately 370 Hz. As shown in FIG. 5, there are four (4) frequency ranges 68(1)-68(4) where a noise signal 70 has higher amplitudes. Thus, it would be advantageous for a battery monitoring device 14 in the battery monitoring system 10(1) in FIG. 2, to avoid setting the frequency of the applied test current to frequencies in these four (4) frequency ranges 68(1)-68(4). This would avoid or reduce the noise signal 70, which would be converted into a DC component on the DC voltage signal 48, affecting the calculation of the SOH of a tested battery cell(s) 18. Thus, if the noise spectrum 66 in FIG. 5 were determined prior to battery 20 testing, the battery monitoring devices 14 could be configured to set the frequency of the test current at a determined reduced-noise frequency in the noise spectrum 66 to a test battery cell(s) 18 to avoid the noise signals 44 being present in the DC voltage signal 48 generated across the tested battery cell(s) 18.

Figure 6:
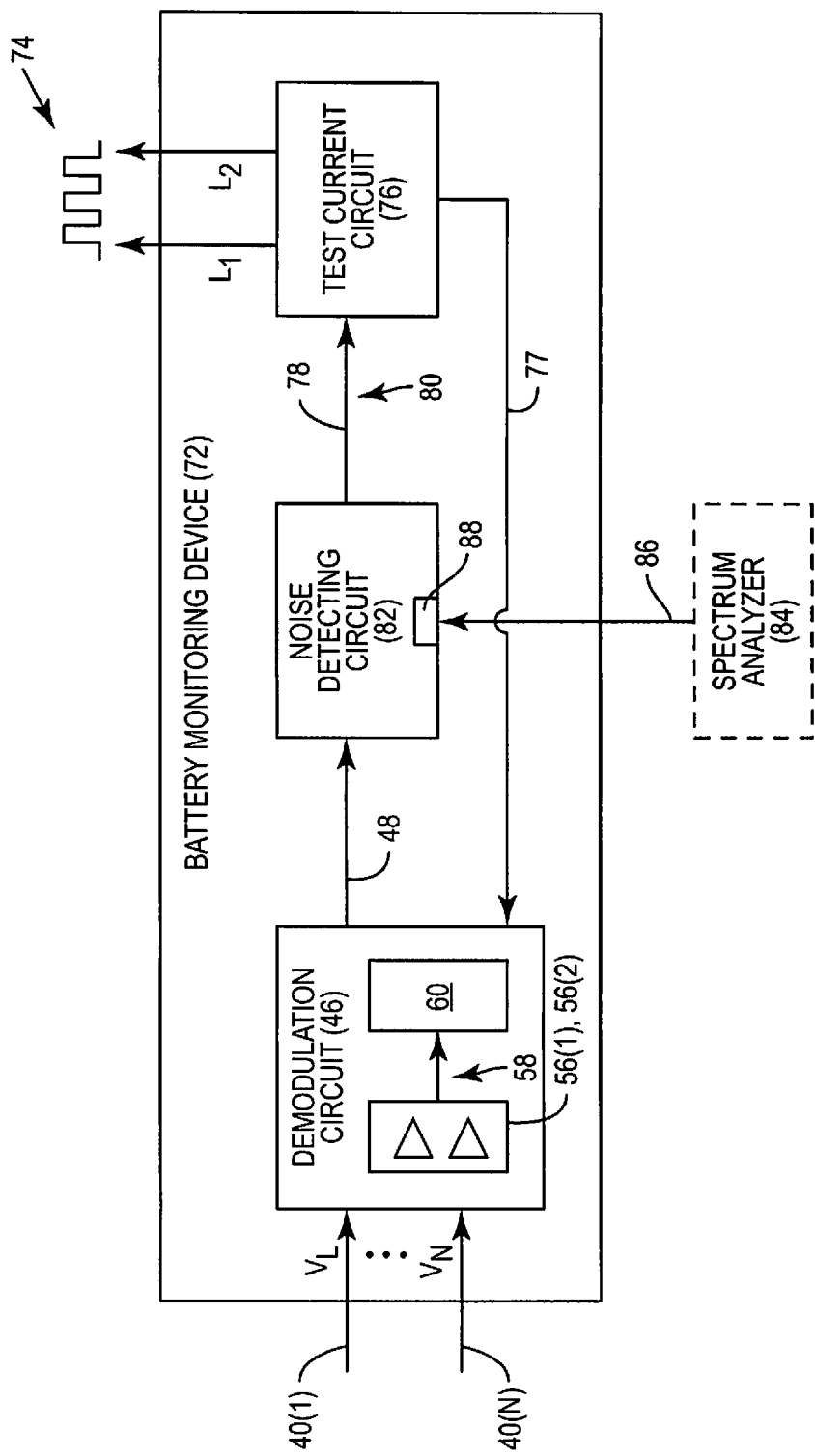
FIG. 6 is a block diagram illustrating an exemplary battery monitoring device that can be provided in the battery monitoring system in FIG. 2 for determining the noise spectrum of the battery power supply system, to select a frequency of applied current pulses to a tested battery cell(s) in the battery power system to reduce the noise level in measured ohmic values of tested battery cell(s)

In this regard, FIG. 6 is a block diagram illustrating the battery monitoring device 72 that can be provided as a battery monitoring device(s) 14 in the battery monitoring system 10(1) of the battery power supply system 23 in FIG. 2. As will be discussed in more detail below, the battery monitoring device 72 is configured to determine a noise spectrum of the battery power supply system 23 in FIG. 2 to select a frequency for a test current 74 to be applied to a tested battery cell(s) 18 in the battery power supply system 23 to reduce the noise level in measured values (e.g., ohmic value) of tested battery cell(s) 18.

In this regard, with reference to FIG. 6, the battery monitoring device 72 includes a test current circuit 76. The test current circuit 76 is configured to generate the test current 74 in the form of an AC pulse signal to be applied to a tested battery cell(s) 18, as previously described with regard to FIGS. 2-4 above. The test current circuit 76 is configured to receive a test frequency setting signal 78 indicating a test frequency setting 80. The test current circuit 76 is configured to inject the test current 74 at a test frequency based on the test frequency setting 80 in the received test frequency setting signal 78 to a tested battery cell(s) 18, to place an effective AC load on the tested battery cell(s) 18.

With continuing reference to FIG. 6, the battery monitoring device 72 also includes a demodulation circuit, which is the demodulator circuit 46 in FIG. 4 in this example. The demodulator circuit 46 is configured to receive an AC voltage signal 40(1)-40(N) generated across at tested battery cell(s) 18(1)-18(N) as a result of the test current 74 being applied to the tested battery cell(s) 18(1)-18(N) by the test current circuit 76. As previously discussed with regard to FIG. 4, the demodulator circuit 46 is configured to convert the received AC voltage signal 40(1)-40(N) to a DC voltage signal 48 indicative of a SOH of the tested battery cell(s) 18(1)-18(N) based on a sampling frequency. In this example, the sampling frequency is the frequency of the test current 74 so as to convert the received AC voltage signal 40(1)-40(N) into the DC voltage signal 48. The sampling frequency can be controlled by a frequency control signal 77 from the test current circuit 76 to synchronize the demodulator circuit 46 to the frequency of the test current 74. The demodulator circuit 46 is also configured to measure the voltage of the DC voltage signal 48 to determine the SOH of the tested battery cell(s) 18(1)-18(N).

With continuing reference to FIG. 6, the battery monitoring device 72 also includes a noise detecting circuit 82. The noise detecting circuit 82 is configured to determine a noise spectrum of the tested battery cell(s) 18(1)-18(N) to determine frequencies at which noise is present and will be induced on the AC voltage signal 40 generated by the tested battery cell(s) 18(1)-18(N). For example, the determined noise spectrum may be similar to the noise spectrum 66 in FIG. 5 previously discussed above. There are different ways to determine the noise spectrum of a tested battery cell(s) 18(1)-18(N), which will be discussed below in more detail. For example, a spectrum analyzer 84 could be used to determine the noise spectrum. As a non-limiting example, a desired frequency determined by an operator by visual inspection as having reduced noise in the noise spectrum from the spectrum analyzer 84 could be manually programmed by a user and input as a noise spectrum input 86 to an input 88 of the noise detecting circuit 82. Alternatively, the spectrum analyzer 84 could provide the determined noise spectrum directly to the input 88 of the noise detecting circuit 82 without operator involvement, for the noise detecting circuit 82 to determine and program a reduced-noise frequency.

Further, the noise detecting circuit 82 could determine the noise spectrum when the test current circuit 76 is not generating the test current 74, such that only induced noise, if present, is provided as the AC voltage signal 40(1)-40(N) into the demodulator circuit 46. In this case, the demodulator circuit 46 could set the sampling frequency to different frequencies over a desired frequency spectrum (e.g., 1 Hz-1000 Hz) to generate DC voltage signals 48 for each frequency in the frequency spectrum. For example, the sampling frequency used by the demodulator circuit 46 could be incremented in defined frequency increments or frequency widths over a desired frequency spectrum. The noise detecting circuit 82 could then analyze the amplitude of the DC voltage signals 48 generated for each sampling frequency to determine which frequencies have lower noise or the least noise.

Regardless of how the noise detecting circuit 82 in the battery monitoring device 72 in FIG. 6 determines the noise spectrum and reduced noise frequencies, the noise detecting circuit 82 can provide a determined test frequency setting 80 in the test frequency setting signal 78 provided to the test current circuit 76. The test frequency setting 80 can be controlled by the noise detecting circuit 82 to set the frequency of the test current to a reduced noise frequency, such that noise is reduced or avoided on the DC voltage signal 48 used to determine the SOH of a tested battery cell(s) 18. The noise detecting circuit 82 may also periodically determine the noise spectrum of the tested battery cell(s) 18 and generate the test frequency setting signal 80 since the noise spectrum may change over time and/or be different at different times.

Figure 7:
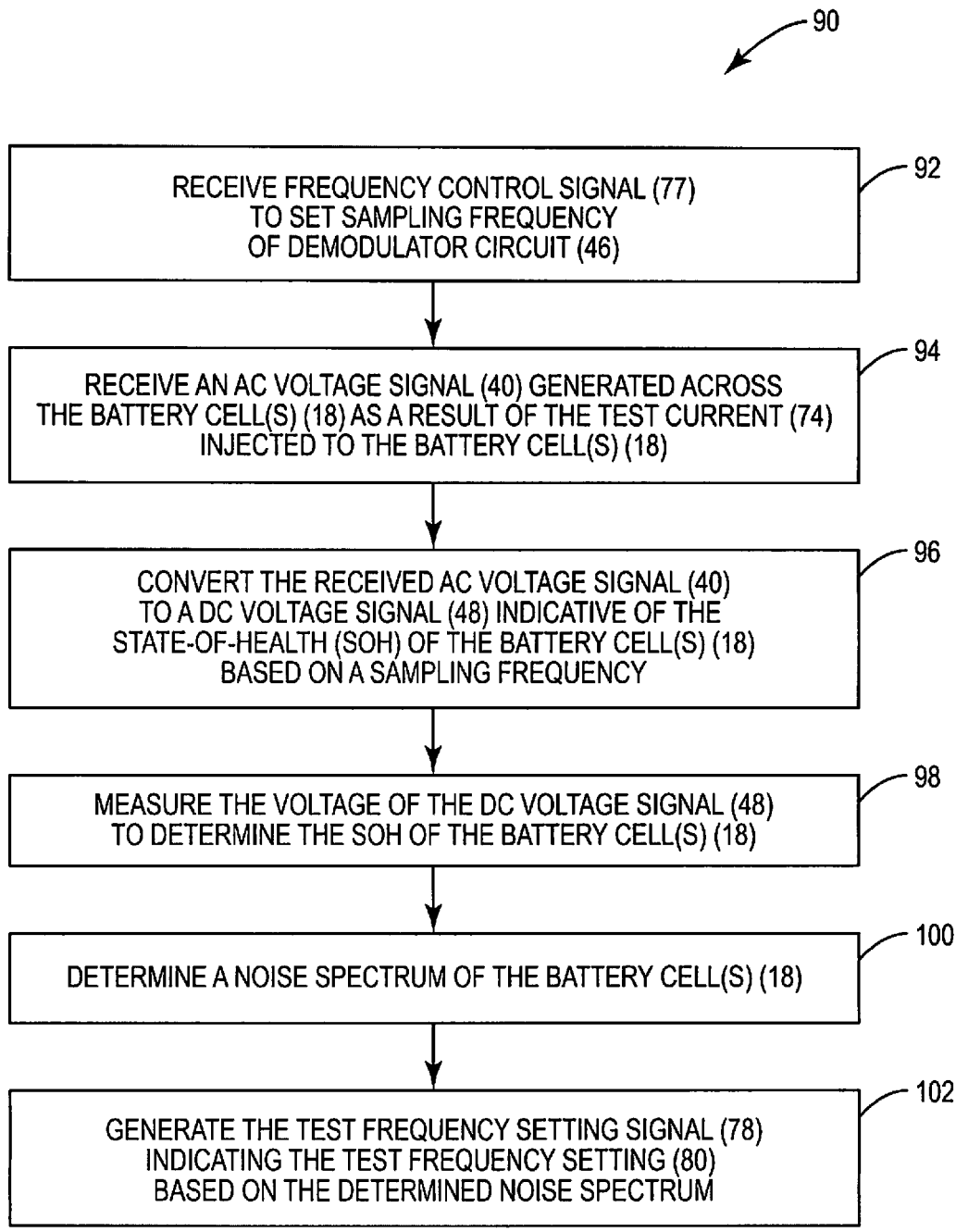
FIG. 7 is a flowchart illustrating an exemplary process of the battery monitoring device in FIG. 6 determining the noise spectrum of the battery power supply system in FIG. 2, to select a frequency of applied current pulses to a tested battery cell(s) in the battery power system to reduce the noise level in measured ohmic values of tested battery cell(s)

FIG. 7 is a flowchart illustrating an exemplary process 90 of the battery monitoring device 14 in FIG. 6 determining the noise spectrum of the tested battery cell(s) 18 and/or battery power supply system 23 in FIG. 2, to select a frequency of the test current to be applied to the tested battery cell(s) 18. In this regard, test current circuit the demodulator circuit 46 receives the frequency control signal 77 from the test current circuit 76 to control and set the sampling frequency of the demodulator circuit 46 (block 92). The demodulator circuit 46 then receives the AC voltage signal 40 generated across the battery cell(s) 18 as a result of the test current (74) applied to the battery cell(s) 18 for the sampling frequency (block 94). Next, the demodulator circuit 46 converts the received AC voltage signal 40 to the DC voltage signal 48 indicative of the SOH of the battery cell(s) 18 based on a sampling frequency (block 96). Next, the demodulator circuit 46 measures the voltage of the DC voltage signal 48 to determine the SOH of the battery cell(s) 18 (block 98). The noise detecting circuit 82 then determines a noise spectrum of the battery cell(s) 18 (block 100). The process in blocks 92-100 can be repeated for different sampling frequencies over a defined frequency spectrum if desired. Finally, the noise detecting circuit 82 generates the test frequency setting signal 78 indicating the test frequency setting 80 based on the determined noise spectrum (block 102).

Figure 8A:
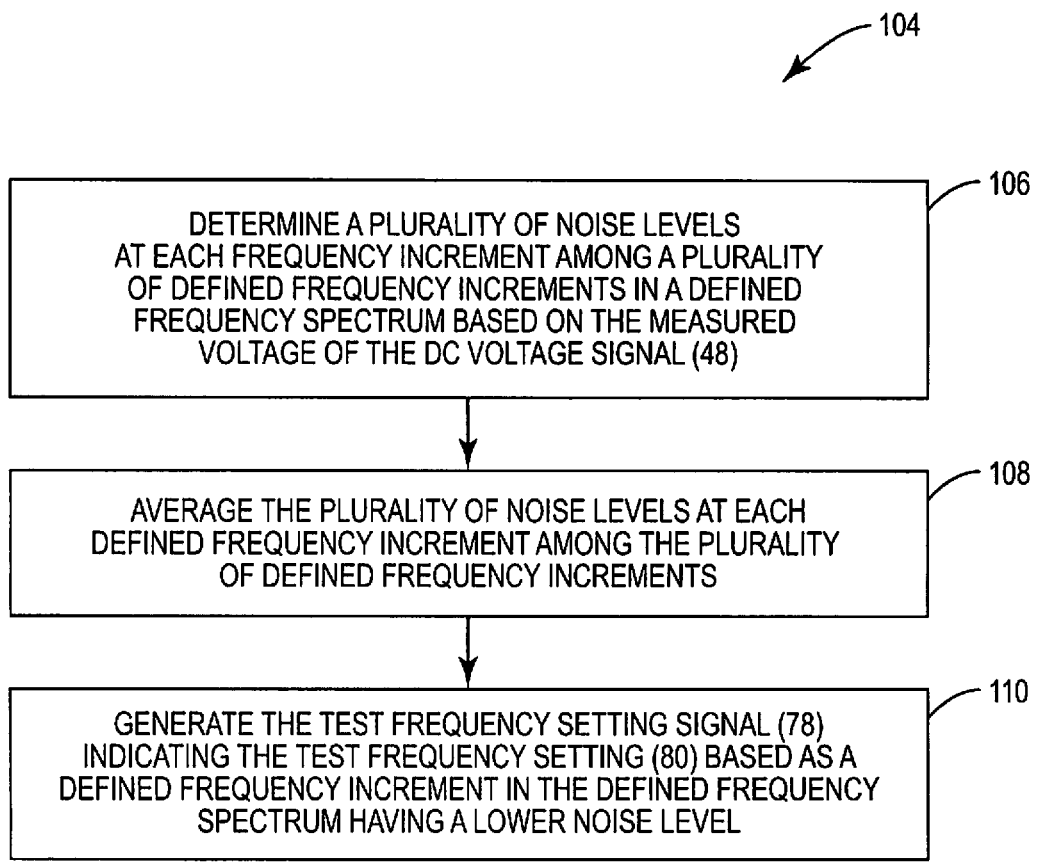
FIG. 8A is a flowchart illustrating an exemplary process of scanning the battery power system in FIG. 2 at various defined frequencies in the battery power supply system in the process in FIG. 7.

As discussed above, there are different ways for the battery monitoring device 70 in FIG. 6 to determine the noise spectrum for the battery cell(s) 18 and/or the battery power supply system 23 in FIG. 2. In this regard, FIG. 8A is a flowchart illustrating exemplary process 104 of scanning the battery power supply system 23 in FIG. 2 at various defined frequencies to determine the noise spectrum according to block 100 in FIG. 7. In this regard, the noise detecting circuit 82 in the battery monitoring device 70 in FIG. 6 can determine a plurality of noise levels at each frequency increment among a plurality of defined frequency increments in a defined frequency spectrum based on the measured voltage of the DC voltage signal 48 (block 106). In this manner, spurious noise present in a defined frequency increment, which may not be indicative of the nominal noise level as such defined frequency increment, can be averaged out. In this regard, the noise detecting circuit 82 can then average the plurality of noise levels at each defined frequency increment among the plurality of defined frequency increments (block 108). The noise detecting circuit 82 can then generate the test frequency setting signal 78 indicating the test frequency setting 80 based as a defined frequency increment in the defined frequency spectrum having a lower noise level (block 110).

Figure 8B:
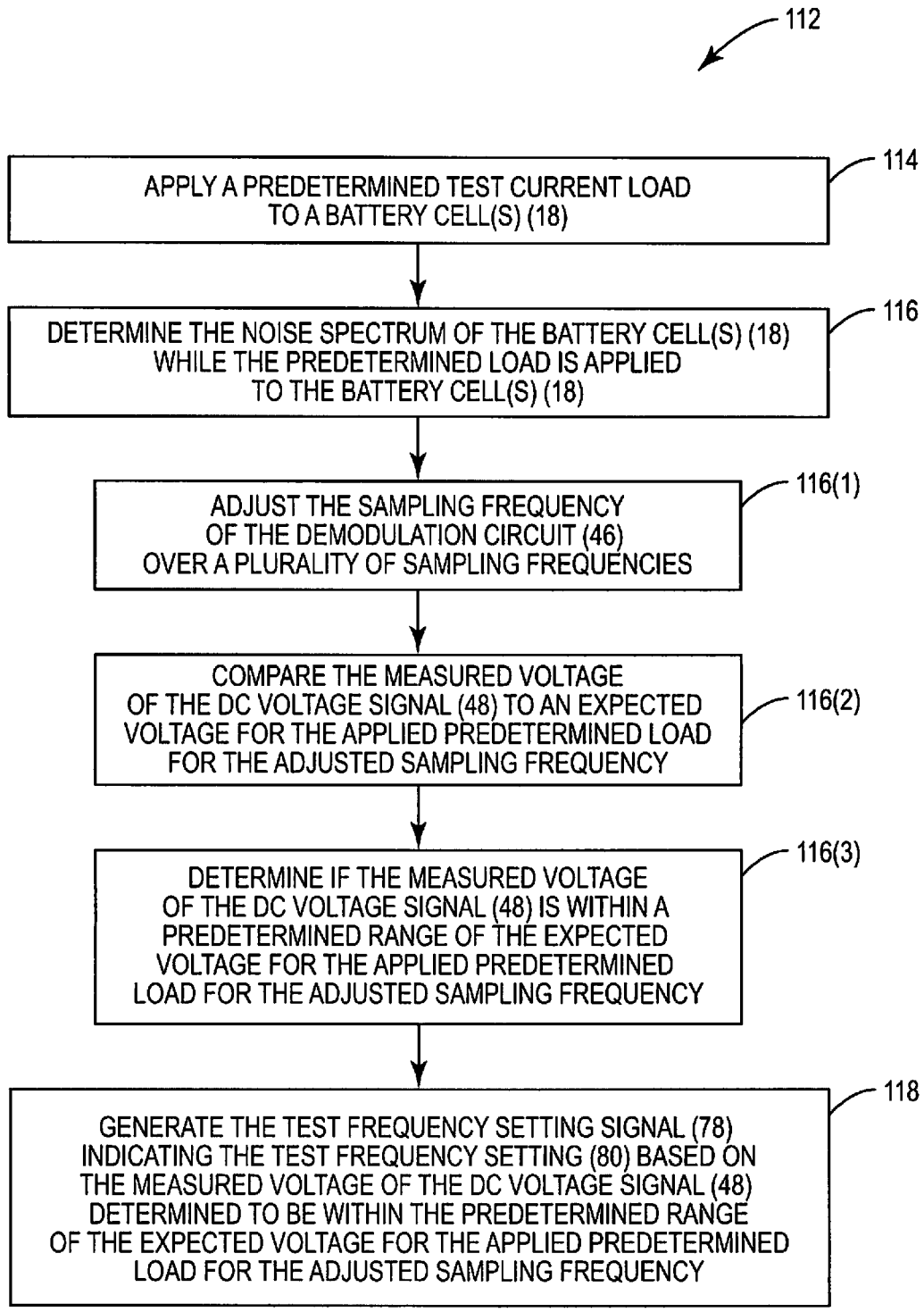
FIG. 8B is a flowchart illustrating another exemplary process for scanning a subset of battery cells in the battery power system in FIG. 2 using various frequencies, to determine the noise spectrum of the battery power supply system in the process in FIG. 7.

FIG. 8B is a flowchart illustrating another exemplary process 112 for scanning a subset of battery cells 18 in the battery power supply system 23 in FIG. 2 using various frequencies, to determine the noise spectrum according to block 100 in FIG. 7. In this process, a known, predetermined test current load is applied to a tested battery cell(s) 18 to determine the noise spectrum of the battery cell(s) 18 and/or the battery power supply system 23 in FIG. 2 (block 114). If the DC voltage signal 48 generated by the tested battery cell(s) 18, as a result of the predetermined load being applied to the tested battery cell(s) 18 for a given frequency of the test current 74, is not within an expected DC voltage range, this is an indication that induced noise is being included in the generated DC voltage signal 48 at the frequency of the test current 74. Thus, that frequency of the test current 74 may not be desired to be used for testing the battery cell(s) 18.

In this regard, with continued reference to FIG. 8B, the battery monitoring device 70 determines the noise spectrum of the battery cell(s) 18 while the predetermined load is applied to the battery cell(s) 18 (block 116). Next, the battery monitoring device 70 adjusts the sampling frequency of the demodulator circuit 46 over a plurality of sampling frequencies (block 116(1)). The battery monitoring device 70 then compares the measured voltage of the DC voltage signal 48 to an expected voltage for the applied predetermined load for the adjusted sampling frequency (block 116(2)). Next, the battery monitoring device 70 determines if the measured voltage of the DC voltage signal 48 is within a predetermined range of the expected voltage for the applied predetermined load for the adjusted sampling frequency (block 116(3)). The noise detecting circuit 82 then generate the test frequency setting signal 78 indicating the test frequency setting 80 based on the measured voltage of the DC voltage signal 48 determined to be within the predetermined range of the expected voltage for the applied predetermined load for the adjusted sampling frequency (block 118). For example, the test frequency setting 80 may be based on the adjusted sampling frequency that produces a DC voltage signal 48 closest to the expected DC voltage for the applied load.

Figure 9:
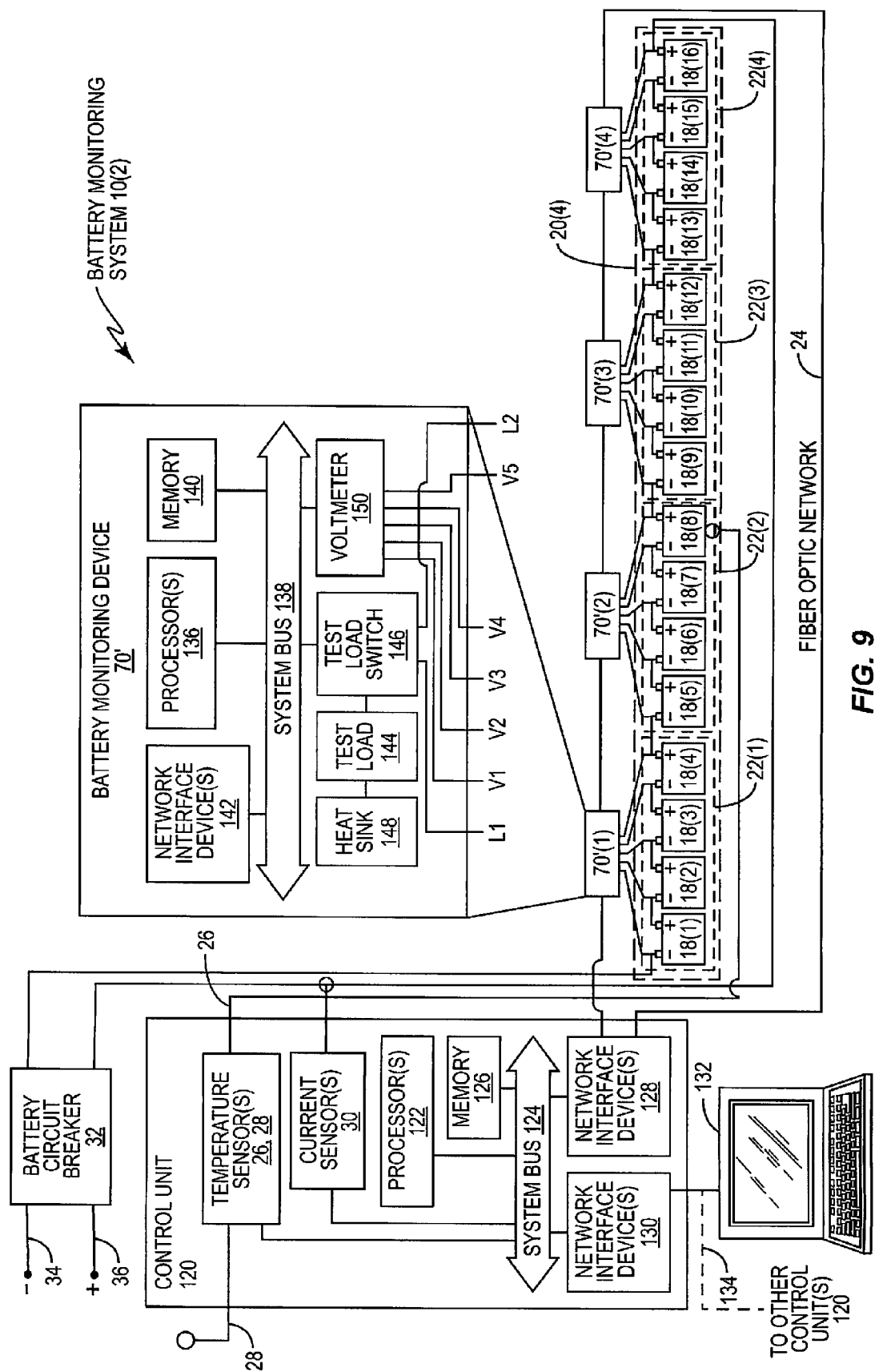
FIG. 9 is a block diagram of an exemplary processor-based battery monitoring system that includes processor-based battery monitoring devices and/or processor-based control unit(s) for determining the noise spectrum of a battery power supply system to reduce the noise level in measured signals of tested battery cell(s) in the battery power supply system, according to embodiments disclosed herein.

The battery monitoring devices disclosed herein for determining the noise spectrum of a battery power supply system to reduce the noise level in measured signals of tested battery cell(s) in a battery power supply system, may be provided in or integrated into any processor-based device. In this regard, FIG. 9 illustrates an example of a processor-based battery monitoring system 10(2) that can employ battery monitoring devices 70', similar to battery monitoring device 70 in FIG. 6, for determining the noise spectrum of a battery power supply system to reduce the noise level in measured signals (e.g., ohmic values) of tested battery cell(s) in a battery power supply system. Common components between the battery monitoring system 10(1) in FIG. 2 and the battery monitoring system 10(2) in FIG. 9 are shown with common elements numbers, and thus will not be re-described.

In this example, the battery monitoring system 10(2) comprises at least one battery monitoring system control unit 120 and a plurality of battery monitoring devices 70' (as a non-limiting example, battery monitoring devices 70'(1)-70'(4)). In this example, the battery monitoring system control unit 120 includes one or more processor(s) 122. The processor(s) 122 is coupled to a system bus 124. As is well known, the battery monitoring system control unit 120 communicates with other system devices on the system bus 124 by exchanging address, control, and data information over the system bus 124. For example, the processor(s) 122 can communicate memory access requests to a memory 126 across the system bus 124.

At least one network interface device(s) 128 may be coupled to the fiber optic network 24 to allow the battery monitoring system control unit 120 to communicate with the battery monitoring devices 70'. The battery monitoring system control unit 120 may also comprise network interface device(s) 130 for communicating with a client computer 132 for accessing the battery monitoring system control unit 120 for monitoring and/or configuration by a user. The client computer 130 and/or battery monitoring system control unit 120 may alert the user to an impending failure or failure of a battery cell 18. The network interface device(s) 130 may be attached to a network 134. In one embodiment, the network 134 may be an RS-485 network, as a non-limiting example. Alternatively, the network 134 may be an Internet Protocol (IP) network or other network allowing other client computers 132 to access the battery monitoring system control unit 120. The network 134 may also allow the client computer 132 to access other battery monitoring system control units 120. The network interface device(s) 130 can be any device(s) configured to allow exchange of data to and from the network 134. The network 134 can be any type of network, including but not limited to, a wired or wireless network, a private or public network, a local area network (LAN), a wide area network (WLAN), and the Internet. The network interface device(s) 128, 130 can be configured to support any type of communication protocol desired. The client computer 132 may be a desktop computer, a laptop computer, a tablet, or other client device.

As also illustrated in FIG. 9, the battery monitoring device 70' comprises processor(s) 136 coupled to a system bus 138. As is well known, the processor(s) 136 also communicate with other devices on the system bus 138 by exchanging address, control, and data information over the system bus 138. For example, the processor(s) 136 can communicate memory access requests to a memory 140. The battery monitoring device 70' also comprises network interface device(s) 142 configured to be coupled to the fiber optic network 24. The battery monitoring device 70' also comprises a resistive test load 144 used for inducing the test current 74 in the subset 22(1) of battery cells 18(1)-18(4) to which the battery monitoring device 70' is coupled. The resistive test load 144 may be a known, predetermined load. The resistive test load 144 is coupled to each end of a subset 22 of the battery cells 18 connected in series. The battery monitoring device 70' also comprises a test load switch 146 for coupling the resistive test load 144 to current leads L1, L2 for inducing the test current 74 in the subset 22 of the battery cells 18 in series. The test load switch 146 may be any kind of switch, including a relay, a transistor, a field effect transistor (FET), or any other type of switch for coupling the resistive test load 144 to the subset 22 of the battery cells 18.

The battery monitoring device 14 also comprises a heat sink 148 for dissipating heat generated by the resistive test load 144 when the resistive test load 144 is coupled to the subset 22 of the battery cells 18. The battery monitoring device 70' also comprises a voltmeter 150 having a plurality of voltage leads V1-V5, for measuring the DC voltages of the DC voltage signal 48 generated by each battery cell 18(1)-18(4) of the subset 22 of the battery cells 18, and to which the battery monitoring device 70' is configured to be coupled.

Figure 10:
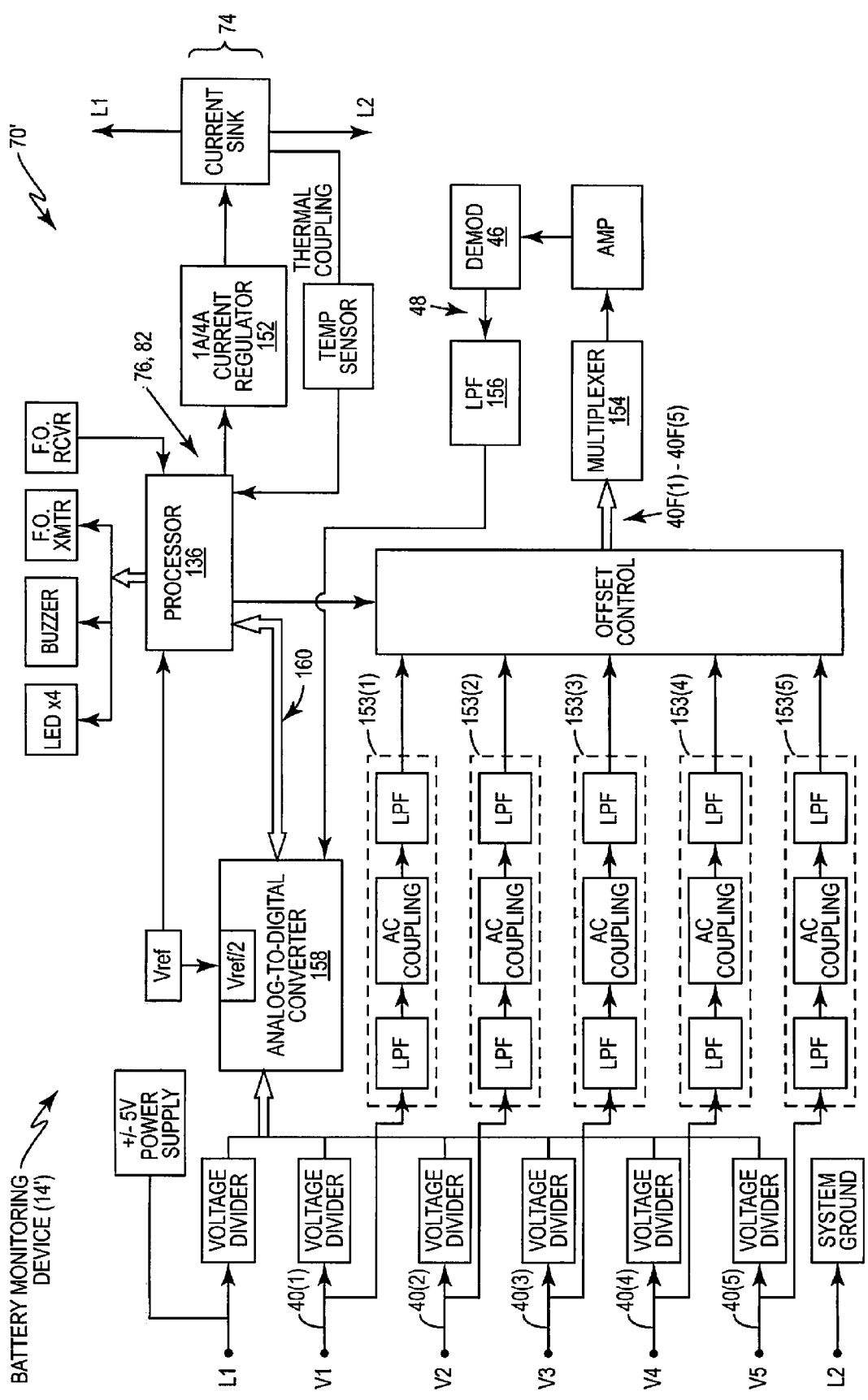
FIG. 10 is a block diagram illustrating additional exemplary internal detail of a battery monitoring device in the battery monitoring system in FIG. 9.

FIG. 10 is a block diagram illustrating additional exemplary internal detail of a battery monitoring device 70' in FIG. 9. In this regard, the processor 136 shown in the battery monitoring device 70' in FIG. 9 is shown. In this example, the processor 136 includes the functionality of the test current circuit 76 and the noise detecting circuit 82 in the battery monitoring device 70 in FIG. 6. The processor 136 is configured to pulse a current regulator 152 at a desired frequency to generate the test current 74 to be applied to a tested battery cell(s) 18 assigned to and selected by the battery monitoring device 70'. In response, as previously discussed, an AC voltage signal 40 is generated by the tested battery cell(s) 18, which in this example could be received as one of AC voltage signals 40(1)-40(5) for V1-V5 for a four (4) battery cell 18 system, as shown in FIGS. 1 and 2.

The AC voltage signals 40(1)-40(5) are provided to respective filters 153(1)-153(5) to then provide the filtered AC voltage signals 40F(1)-40F(5) to a multiplexer 154. The multiplexer 154 selects one of the filtered AC voltage signals 40F(1)-40F(5) based on the tested battery cell 18 or tested battery cells 18 selected for testing, to provide to the demodulator circuit 46. As previously discussed, the demodulator circuit 46 is configured to convert a received filtered AC voltage signal 40F(1)-40F(5) into the DC voltage signal 48. In this example, the DC voltage signal 48 is further filtered by low pass filter 156 and provided to an analog-to-digital converter (ADC) 158. The ADC 158 converts the DC voltage signal 48 into a digital DC voltage signal 160, which can then be communicated to the processor 136 to be analyzed to determine the SOH of the tested battery cell(s) 18.

Those of skill in the art will further appreciate that the various illustrative logical blocks, modules, circuits, and algorithms described in connection with the embodiments disclosed herein may be implemented as electronic hardware, instructions stored in memory or in another computer-readable medium and executed by a processor or other processing device, or combinations of both. The battery monitoring system control units and battery monitoring devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a processor, a Demand-Side Platform (DSP), an Application Specific Integrated Circuit (ASIC), an Field-Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The embodiments disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a Compact Disk-ROM (CD-ROM), or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary embodiments herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary embodiments may be combined. It is to be understood that the operational steps illustrated in the flow chart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A battery monitoring device for testing at least one battery cell in a battery power system, comprising:
    a test current circuit configured to:
        receive a test frequency setting signal indicating a test frequency setting; and
        apply a test current pulse at a test frequency based on the test frequency setting in the received test frequency setting signal to at least one battery cell, to place an effective alternating current (AC) load on the at least one battery cell;
    a demodulation circuit configured to:
        receive an AC voltage signal generated across the at least one battery cell as a result of the test current pulse applied to the at least one battery cell;
        convert the received AC voltage signal to a direct current (DC) voltage signal indicative of a state-of-health (SOH) of the at least one battery cell based on a sampling frequency; and
        measure the voltage of the DC voltage signal to determine the SOH of the at least one battery cell;
    a noise detecting circuit configured to:
        determine a noise spectrum of the at least one battery cell; and
        generate the test frequency setting signal indicating the test frequency setting based on the determined noise spectrum as the test frequency setting.

2. The battery monitoring device of claim 1, wherein a noise scanning circuit is configured to determine the noise spectrum of the at least one battery cell while the test current circuit is not applying the test current pulse to the at least one battery cell.

3. The battery monitoring device of claim 1, wherein the demodulation circuit is comprised of a synchronous demodulation circuit.

4. The battery monitoring system of claim 3, wherein the synchronous demodulation circuit is configured to convert the received AC voltage signal to the DC voltage signal based on a sampling frequency equal to the test frequency.

5. The battery monitoring device of claim 1, wherein the noise detecting circuit is further configured to determine at least one reduced-noise frequency in the noise spectrum;
the noise detecting circuit configured to generate the test frequency setting signal indicating the test frequency setting based on the determined at least one reduced-noise frequency as the test frequency setting.

6. The battery monitoring device of claim 1, wherein the demodulation circuit further comprises an AC filter configured to filter AC signals from the DC voltage signal.

7. The battery monitoring device of claim 1, wherein the test current circuit is further configured to receive the test frequency setting signal indicating the test frequency setting from a programmed test frequency setting.

8. The battery monitoring device of claim 6, wherein the test current circuit is configured to receive the test frequency setting signal indicating the programmed test frequency setting based on a user sampling frequency setting.

9. The battery monitoring device of claim 1, wherein the noise spectrum is comprised of a plurality of noise levels each at a defined frequency increment in a defined frequency spectrum.

10. The battery monitoring device of claim 9, wherein the noise detecting circuit is configured to generate the test frequency setting signal indicating the test frequency setting based on a defined frequency increment in the defined frequency spectrum having a lower noise level noise.

11. The battery monitoring device of claim 9, wherein the noise detection circuit is configured to periodically:
determine the noise spectrum of the at least one battery cell; and
generate the test frequency setting signal indicating the test frequency setting based on the determined noise spectrum as the test frequency setting.

12. The battery monitoring device of claim 1, wherein the noise scanning circuit is configured to determine the noise spectrum of the at least one battery cell from a spectrum analyzer used to determine the noise spectrum of the at least one battery cell over a defined frequency spectrum.

13. The battery monitoring device of claim 12, wherein the defined frequency spectrum is between approximately 1 Hz and approximately 1000 Hz.

14. The battery monitoring device of claim 1, wherein the noise detecting circuit is further configured to:
receive a measured voltage of the DC voltage signal; and
determine the noise spectrum of the at least one battery cell by being configured to scan a noise in the at least one battery cell over a defined frequency spectrum based on the received measured voltage of the DC voltage signal.

15. The battery monitoring device of claim 14, wherein the defined frequency spectrum is between approximately 1 Hz and approximately 1000 Hz.

16. The battery monitoring device of claim 14, wherein the noise detecting circuit is configured to determine the noise spectrum of the at least one battery cell by being configured to:
determine a plurality of noise levels at each frequency increment among a plurality of defined frequency increments in a defined frequency spectrum based on the received measured voltage of the DC voltage signal; and
average the plurality of noise levels at each defined frequency increment among the plurality of defined frequency increments.

17. The battery monitoring device of claim 16, wherein the noise detecting circuit is configured to generate the test frequency setting signal indicating the test frequency setting based on a defined frequency increment in the defined frequency spectrum having a lower noise level.

18. The battery monitoring device of claim 1, wherein the noise detecting circuit is further configured to apply a predetermined load to the at least one battery cell;
the noise detecting circuit configured to determine the noise spectrum of the at least one battery cell while the predetermined load is applied to the at least one battery cell.

19. The battery monitoring device of claim 18, wherein the noise detecting circuit is configured to determine the noise spectrum of the at least one battery cell while the predetermined load is applied to the at least one battery cell, by being configured to:
adjust the sampling frequency of the demodulation circuit over a plurality of sampling frequencies;
for each adjusted sampling frequency among the plurality of sampling frequencies;
compare the measured voltage of the DC voltage signal to an expected voltage for the applied predetermined load for the adjusted sampling frequency;
determine if the measured voltage of the DC voltage signal is within a predetermined range of the expected voltage for the applied predetermined load for the adjusted sampling frequency; and
generate the test frequency setting signal indicating the test frequency setting based on the measured voltage of the DC voltage signal determined to be within the predetermined range of the expected voltage for the applied predetermined load for the adjusted sampling frequency.

20. A method of testing at least one battery cell in a battery power system, comprising:
applying a test current pulse at a test frequency based on a test frequency setting in a received test frequency setting signal to at least one battery cell, to place an effective alternating current (AC) load on the at least one battery cell;
receiving an AC voltage signal generated across the at least one battery cell as a result of the test current pulse applied to the at least one battery cell;
converting the received AC voltage signal to a direct current (DC) voltage signal indicative of a state-of-health (SOH) of the at least one battery cell based on a sampling frequency;
measuring the voltage of the DC voltage signal to determine the SOH of the at least one battery cell;
determining a noise spectrum of the at least one battery cell; and
generating the test frequency setting signal indicating the test frequency setting based on the determined noise spectrum as the test frequency setting.

21. The method of claim 20, comprising determining the noise spectrum of the at least one battery cell when not applying the test current pulse to the at least one battery cell.

22. The method of claim 20, comprising converting the received AC voltage signal to the DC voltage signal indicative of the state-of-health (SOH) of the at least one battery cell based on the sampling frequency equal to the test frequency.

23. The method of claim 20, further comprising:
determining at least one reduced-noise frequency in the noise spectrum; and
generating the test frequency setting signal indicating the test frequency setting based on the determined at least one reduced-noise frequency as the test frequency setting.

24. The method of claim 20, wherein:
determining the noise spectrum of the at least one battery cell noise spectrum comprising determining a plurality of noise levels each at a defined frequency increment in a defined frequency spectrum; and
generating the test frequency setting signal comprising generating the test frequency setting signal indicating the test frequency setting based on the defined frequency increment in the defined frequency spectrum having a lower noise level noise.

25. The method of claim 20, comprising periodically:
determining the noise spectrum of the at least one battery cell; and
generating the test frequency setting signal indicating the test frequency setting based on the determined noise spectrum as the test frequency setting.

26. The method of claim 20, comprising determining the noise spectrum of the at least one battery cell from a spectrum analyzer used to determine the noise spectrum of the at least one battery cell over a defined frequency spectrum.

27. The method of claim 20, wherein determining the noise spectrum of the at least one battery cell comprises scanning noise in the at least one battery cell over a defined frequency spectrum based on the received measured voltage of the DC voltage signal.

28. The method of claim 20, further comprising applying a predetermined load to the at least one battery cell; and
determining the noise spectrum of the at least one battery cell while the predetermined load is applied to the at least one battery cell.

29. A non-transitory computer-readable medium having stored thereon computer-executable instructions to cause a processor to implement a method for testing at least one battery cell in a battery power system, comprising:
applying a test current pulse at a test frequency based on a test frequency setting in a received test frequency setting signal to at least one battery cell, to place an effective alternating current (AC) load on the at least one battery cell;
receiving an AC voltage signal generated across the at least one battery cell as a result of the test current pulse applied to the at least one battery cell;
converting the received AC voltage signal to a direct current (DC) voltage signal indicative of a state-of-health (SOH) of the at least one battery cell based on a sampling frequency;
measuring the voltage of the DC voltage signal to determine the SOH of the at least one battery cell;
determining a noise spectrum of the at least one battery cell; and
generating the test frequency setting signal indicating the test frequency setting based on the determined noise spectrum as the test frequency setting.

30. A battery monitoring system for testing battery cells in a battery power system, comprising:

a plurality of battery monitoring devices, each battery monitoring device configured to be coupled to a subset of a plurality of battery cells electrically connected in series to form a battery,
wherein each battery monitoring device comprises a plurality of current leads configured to be coupled to the subset of the plurality of battery cells assigned to the battery monitoring device to:
apply a test current pulse at a test frequency based on a test frequency setting in a received test frequency setting signal to the subset of the plurality of battery cells, to place an effective alternating current (AC) load on the subset of the plurality of battery cells;
receive an AC voltage signal generated across the subset of the plurality of battery cells as a result of the test current pulse applied to the subset of the plurality of battery cells; and
convert the received AC voltage signal to a direct current (DC) voltage signal indicative of a state-of-health (SOH) of the subset of the plurality of battery cells based on a sampling frequency;
wherein each battery monitoring device further comprises a plurality of voltage leads configured to be coupled to the subset of the plurality of battery cells assigned to the battery monitoring device to measure the voltage of the DC voltage signal to determine the SOH of the subset of the plurality of battery cells;
a battery monitoring system control unit configured to:
control each battery monitoring device among the plurality of battery monitoring devices to test a subset of the plurality of battery cells coupled to the battery monitoring device; and
receive at least one battery current measurement from each battery monitoring device among the plurality of battery monitoring devices indicating the SOH of the subset of the plurality of battery cells coupled to the battery monitoring device;
at least one battery monitoring device among the plurality of battery monitoring devices, configured to:
determine a noise spectrum of the subset of the plurality of battery cells coupled to the at least one battery monitoring device; and
generate the test frequency setting signal indicating the test frequency setting based on the determined noise spectrum as the test frequency setting.

31. The battery monitoring system of claim 30, wherein the at least one battery monitoring device is configured to determine the noise spectrum of the at least one battery cell while the test current circuit is not applying the test current pulse to the at least one battery cell.

32. The battery monitoring system of claim 30, wherein the sampling frequency is equal or substantially equal to the test frequency.

33. The battery monitoring system of claim 30, wherein the at least one battery monitoring device is further configured to determine at least one reduced-noise frequency in the noise spectrum;
the at least one battery monitoring device configured to generate the test frequency setting signal indicating the test frequency setting based on the determined at least one reduced-noise frequency as the test frequency setting.

34. The battery monitoring system of claim 30, wherein the battery monitoring system control unit further comprising a test frequency setting input, wherein the battery monitoring system control unit is further configured to receive the test frequency setting signal indicating the test frequency setting input over the test frequency setting input from a user.

35. The battery monitoring system of claim 30, wherein the at least one battery monitoring device is configured to determine the noise spectrum of the at least one battery cell from a spectrum analyzer used to determine the noise spectrum of the at least one battery cell over a defined frequency spectrum.

36. The battery monitoring system of claim 30, wherein the at least one battery monitoring device is further configured to:
   receive the measured voltage of the DC voltage signal; and
   determine the noise spectrum of the at least one battery cell by being configured to scan noise in the at least one battery cell over a defined frequency spectrum based on the received measured voltage of the DC voltage signal.

37. The battery monitoring system of claim 30, wherein:
   the at least one battery monitoring device is further configured to apply a predetermined load to the at least one battery cell; and
   the at least one battery monitoring device is further configured to determine the noise spectrum of the at least one battery cell while the predetermined load is applied to the at least one battery cell.

* * * * *